United States Patent [19]

Ogasawara et al.

[11] 4,300,093
[45] Nov. 10, 1981

[54] DEVICE FOR MEASURING THE AMOUNT OF ROTATION OF A ROTATING OBJECT

[76] Inventors: Hiroomi Ogasawara, 3821-4; Masaomi Ogasawara, 3833, both of Yamakita, Yamakitamachi, Ashigarakami-gun, Kanagawa-ken, Japan

[21] Appl. No.: 99,250

[22] Filed: Dec. 3, 1979

[51] Int. Cl.³ .......................................... G01R 27/26
[52] U.S. Cl. ............................ 324/61 R; 324/61 QS
[58] Field of Search ................ 324/61 R, 61 P, 61 QS

[56] References Cited

U.S. PATENT DOCUMENTS

| | | | |
|---|---|---|---|
| 2,611,964 | 9/1952 | Buisson | 324/61 R X |
| 2,613,249 | 10/1952 | Babb | 324/61 R |
| 2,675,540 | 4/1954 | Schultheis, Jr. . | |
| 2,925,590 | 2/1960 | Boltinghouse et al. | 324/61 P |
| 3,146,394 | 8/1964 | Frisch | 324/61 R X |
| 3,219,925 | 11/1965 | Borley et al. | 324/61 R |
| 3,221,256 | 11/1965 | Walden | 324/61 P |
| 3,222,591 | 12/1965 | Mynall | 324/61 R X |
| 3,227,952 | 1/1966 | Proebster et al. | 324/61 QS |
| 3,237,447 | 3/1966 | McKeown | 324/61 QS |
| 3,702,467 | 11/1972 | Melnyk . | |
| 3,723,866 | 3/1973 | Michaud . | |
| 3,860,918 | 1/1975 | Cencel . | |
| 3,938,077 | 2/1976 | Nakanishi et al. . | |
| 3,990,005 | 11/1976 | Abbe et al. . | |

FOREIGN PATENT DOCUMENTS 1091346 10/1960 Fed. Rep. of Germany .... 324/61 R

Primary Examiner—Stanley T. Krawczewicz
Attorney, Agent, or Firm—Beveridge, DeGrandi, Kline & Lunsford

[57] ABSTRACT

A device for measuring the amount of rotation of a rotating object is provided with a sensor unit made up of the rotating object and stationary members arranged to form two pairs of capacitors therebetween. The confronting surfaces of the rotating object and stationary members are graduated with gear-like cuts so that while the capacitances of two of two pairs of capacitors are maximum, the capacitances of the other capacitors are minimum. The device further comprises a pair of oscillators coupled to the two pairs of capacitors, and a mixer connected to the oscillators so that the difference in capacitance between the capacitors is obtained as the difference in frequency, which is processed to provide the amount of movement of the moving object.

6 Claims, 10 Drawing Figures

(a)

(b)

(c)

DEVICE FOR MEASURING THE AMOUNT OF ROTATION OF A ROTATING OBJECT

BACKGROUND OF THE INVENTION

This invention relates to a device for electrically measuring the amount of rotation of a rotating object.

For instance, the amount of rotation of a rotating object can be, in general, detected by a method in which the rotating object is graduated in equal spaces, and the amount of rotation of the rotating object is obtained by reading the graduations.

In the case where the amount of rotation should be read with high precision, it is assumed that the reading is effected by the second, i.e., by the unit of 1/3600 of one degree. Then, the periphery of the rotating object must be graduated by dividing it into 1,296,000 (360×60×60) divisions.

However, such division is practically impossible. Accordingly, a device for measuring the amount of movement with high accuracy has not been proposed yet.

SUMMARY OF THE INVENTION

Accordingly, an object of this invention is to provide a device which is capable of measuring the amount of rotation of a rotating object with a high accuracy of the order of less than one second.

This object and other objects of the invention have been achieved by providing a device for measuring the amount of rotation of a rotating object, in which one rotating object and two or an even multiple of stationary members are provided in such a manner that the rotating object confronts the stationary members to form at least one pair of capacitors which are coupled respectively to oscillators, and the confronting surfaces of the rotating object and the stationary members are graduated with gear-like cuts so that while the capacitance of one of the capacitors is increased, the capacitance of the other is decreased, in a differential mode.

Owing to this arrangement, a signal whose frequency is linearly increased and decreased in succession with the movement of the rotating object can be obtained. The amount of rotation of the rotating object can be obtained with high accuracy if the signal is counted as it is, or after it is, divided into parts or if it is processed in other methods.

The differential graduations are employed according to the invention. Therefore, if the relative positional relationships between the rotating object and the two stationary members confronting the rotating object are individually detected and then combined, a signal which is the average of the two relative position outputs can be obtained. Therefore, even if the graduations are made somewhat erroneously, the effect of the error is minimized.

The principle, nature and utility of the invention will become more apparent from the following detailed description when read in conjunction with the accompanying drawings.

Figure 2:
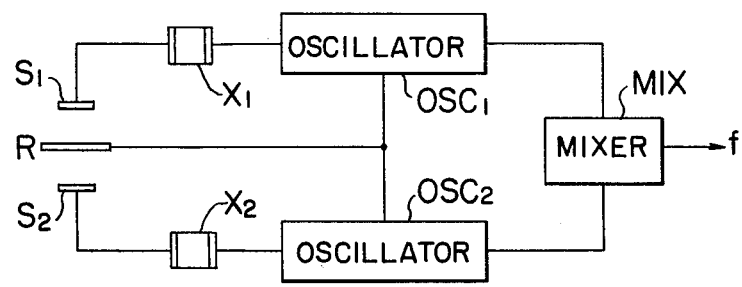
FIG. 2 is a block diagram showing a circuit used in combination with the sensor unit shown in FIG. 1.
Figure 3:
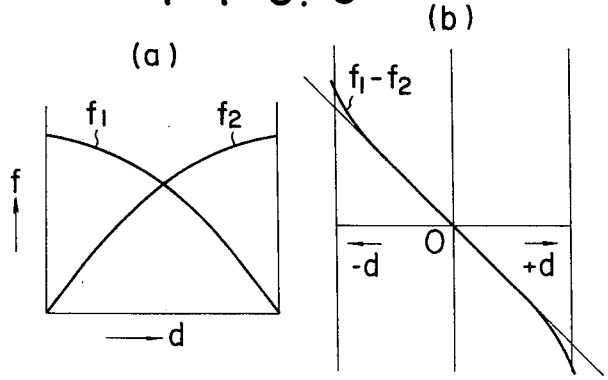
Figure 4:
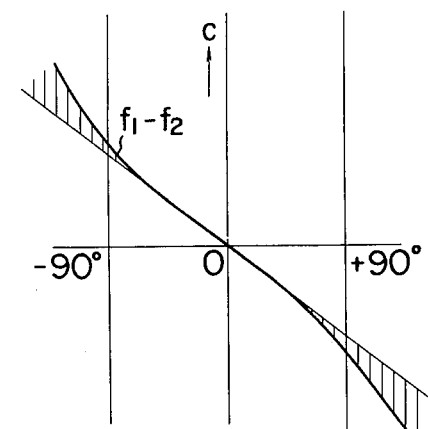
Figure 4:
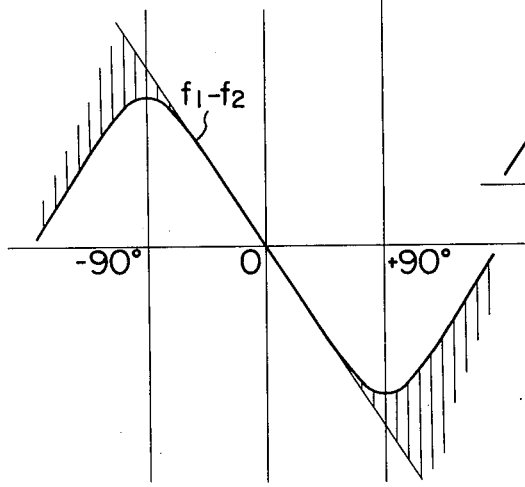
Figure 4:
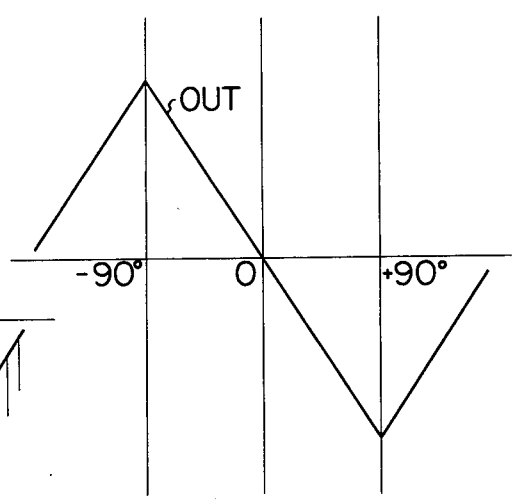
Figure 5:
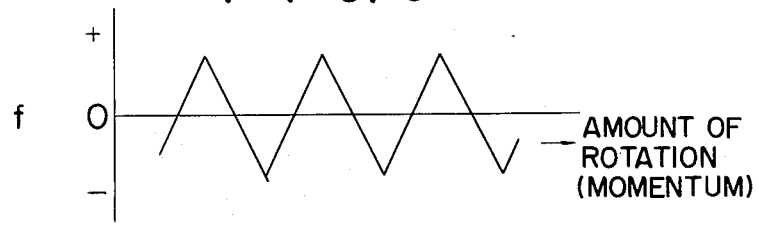
Figure 6:
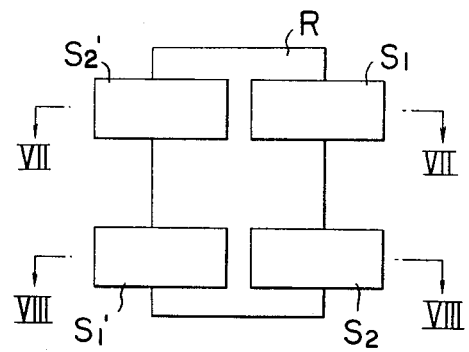
Figure 7:
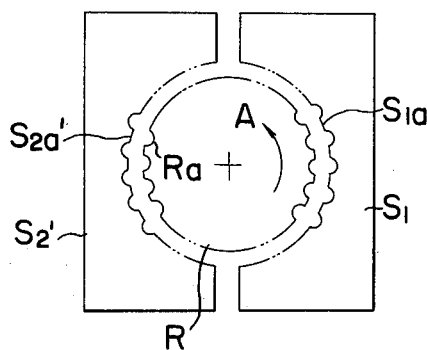
Figure 8:
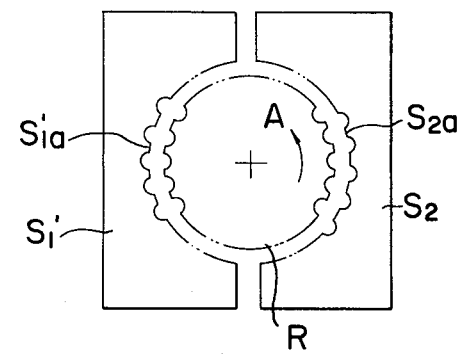
Figure 9:
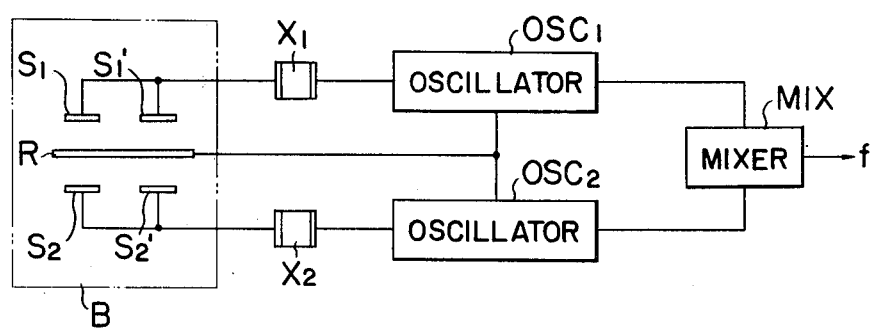
Figure 10:
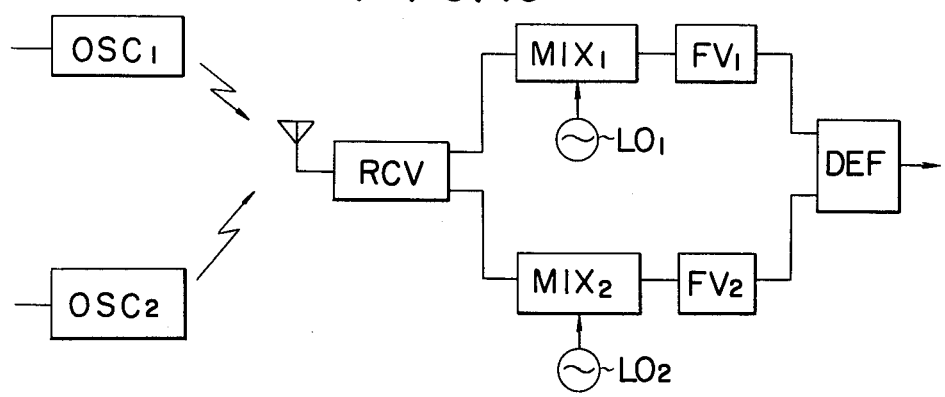

The parts (a) and (b) of FIG. 3 and the parts (a), (b) and (c) of FIG. 4 are graphical representations illustrating the operating principle of a device according to the invention;

FIG. 5 is a graphical representation indicating the output characteristic curve of the circuit shown in FIG. 2;

FIG. 6 through FIG. 8 are explanatory diagrams showing another example of a sensor unit for a rotating object;

FIG. 9 is a block diagram showing a circuit used in combination with the sensor unit shown in FIGS. 6 through 8; and FIG. 10 is a block diagram showing another example of a circuit employed in the invention.

DETAILED DESCRIPTION OF THE INVENTION

Figure 1:
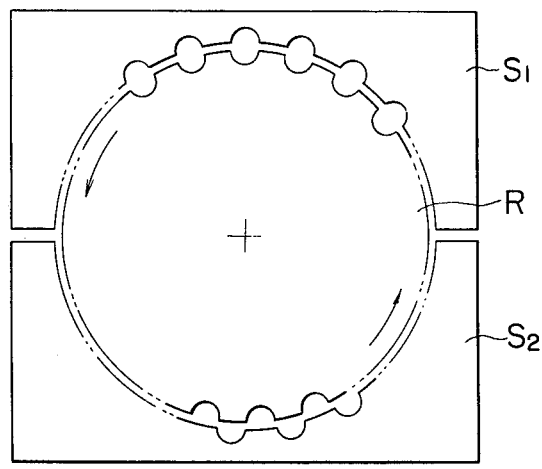
FIG. 1 is an explanatory diagram showing one example of a sensor unit in a device for measuring the amount of rotation of a rotating object according to the invention.

FIG. 1 shows one example of a sensor unit in a device for measuring the amount of movement of a moving object according to this invention. In FIG. 1, reference character R designates a rotating object which rotates in synchronization with the aforementioned object to be measured. The peripheral portion of the rotating object is graduated with gear-like cuts in equal spaces. Two stationary members $S_1$ and $S_2$ surround the rotating object. The edges of these stationary members $S_1$ and $S_2$ which confront the periphery of the rotating object are marked out with gear-like cuts in spaces equal to those of the rotating object R. However, it should be noted that the relation of the graduations between the rotating object R and the stationary member $S_1$ is shifted by 180° in phase from the relation of the graduations between the rotating object R and the stationary member $S_2$. In other words, if it is assumed that the portions of the edge, which are not cut or recessed, of the stationary member $S_1$ (hereinafter referred to as "the protrusions of the edge" when applicable) coincide with the protrusions of the periphery of the rotating object R, then the protrusions of the edge of the stationary member $S_2$ coincide with the recesses of the periphery of the rotating object R. Accordingly, if it is considered that the rotating object R and the stationary member $S_1$ form one capacitor and the rotating object R and the stationary member $S_2$ form another capacitor, then when the capacitance of the capacitor formed by the rotating object R and the stationary member $S_1$ is the maximum, the capacitance of the capacitor formed by the rotating object and the stationary member $S_2$ is the minimum.

FIG. 2 shows one example of a circuit used in combination with the sensor unit shown in FIG. 1. In the circuit, crystal resonators $X_1$ and $X_2$ are used in combination with oscillators $OSC_1$ and $OSC_2$, respectively. Originally, the oscillating frequency of a crystal resonator is fixed. However, in this case, the crystal resonators are connected in parallel with the capacitors formed by the rotating object R and the stationary members $S_1$ and $S_2$, and therefore the oscillating frequency of each crystal resonator is varied as much as the variation in capacitance of the respective capacitor. The variation in capacitance of the capacitors is a so-called "differential variation", in which while the capacitance of one capacitor is increased, the capacitance of the other capacitor is decreased. Accordingly, while the oscillating frequency of one of the oscillators $OSC_1$ and $OSC_2$ is increased, that of the other is decreased. If these two frequency signals are mixed with each other in a mixer MIX, then the difference frequency f between them can be obtained. The difference signal is transmitted to a signal processing circuit by wire or wireless communication.

The parts (a) and (b) of FIG. 3 are graphical representations indicating the outputs of the oscillators $OSC_1$ and $OSC_2$ and the output of the mixer MIX, which are provided as the rotating object R is rotated with respect to the stationary members $S_1$ and $S_2$. For convenience in description, a relative average distance d between the rotating object R and the stationary members $S_1$ and $S_2$ will be employed. As the rotating object R is rotated approximately one graduation with respect to the stationary members $S_1$ and $S_2$, the output frequencies $f_1$ and $f_2$ of the oscillators $OSC_1$ and $OSC_2$ change non-linearly as indicated in the part (a) of FIG. 3. It should be noted that the variations of the output frequencies $f_1$ and $f_2$ are symmetrical. If a characteristic curve $(f_1-f_2)$ is obtained from the variations of the output frequencies, then it includes a substantially linear portion as indicated in the part (b) of FIG. 3.

The parts (a) through (c) of FIG. 4 indicate the fact that if the non-linear portion of a substantially linear characteristic curve (the part (a) of FIG. 4) obtained by the differential operation between a movable electrode and stationary electrodes is superposed on a substantially sinusoidal characteristic curve (the part (b) of FIG. 4) obtained by the rotation of the rotating object with respect to the stationary members, a characteristic curve which is linear in a range of from $+90°$ to $-90°$ and is a triangular wave characteristic curve as a whole can be obtained.

The configuration of the substantially sinusoidal characteristic curve can be changed optionally to some extent by suitably selecting the size of the rotating object R and the stationary members $S_1$ and $S_2$ and the distance between the electrodes. Thus, the triangular wave characteristic curve shown in the part (c) of FIG. 4 can be obtained by superposing the substantially sinusoidal characteristic curve on the both end portions of the substantially linear characteristic curve which are greatly deviated from the straight line. The triangular wave characteristic curve has an inflection point every predetermined rotation angle, and therefore can be used for the detection of a rotation angle in which the linear portion of the waveform is utilized, and for the detection of rotation in which the rise and fall portions of the waveform are utilized.

In the above-described example, a single moving object is arranged between a pair of stationary members in such a manner that they are in one and the same plane; however, the invention is not limited thereto or thereby. For instance, it is possible that stationary members can be arrangd in a plurality of parallel planes, respectively, and one moving object is arranged commonly for these stationary members.

FIG. 5 shows the continuous variation of the difference frequency signal f with the rotation of the rotating object R. As the rotating object rotates, the difference frequency is increased at a graduation pitch, but it is decreased at the next graduation pitch. It is necessary to linearly increase and decrease the frequency. This can be achieved by suitably selecting the configurations of the gear-like cuts, i.e., the recesses and protrusions of the rotating object R and the stationary members $S_1$ and $S_2$.

As the frequency is repeatedly increased and decreased linearly, one graduation pitch can be divided into equal parts. Accordingly, the reading can be accomplished with much more precision than that of the graduation pitch. For instance, it is assumed that the graduation pitch is of a unit of one degree. If, in this case, this graduation pitch is divided into one hundred parts, then the reading can be made by the unit of 0.6 second. If the graduation pitch can be divided into more parts, then the pitch intervals can be made to be longer.

FIG. 6 through FIG. 8 show another example of the sensor according to the invention. FIG. 6 is a side view showing the relation between a moving object R and stationary members $S_1$, $S_1'$, $S_2$ and $S_2'$. FIG. 7 is a sectional view taken along line VII—VII in FIG. 6. FIG. 8 is a sectional view taken along line VIII—VIII in FIG. 6.

The moving object R is rotated in the direction of the arrow A. The moving object R has a gear-like graduation Ra cut in equal spaces in the cylindrical outer wall. The stationary members $S_1$ and $S_1'$ also have gear-like graduations S1a and S1'a which are in phase with each other with respect to the graduation Ra. The stationary members S2 and S2' also have gear-like graduations S2a and S2'a which are in phase with each other with respect to the graduation Ra. However, it should be noted that the graduations S1a and S2a of the stationary members $S_1$ and $S_2$ are different by 180° in phase from each other with respect to the graduation Ra. Similarly, the graduations S1'a and S2'a of the stationary members S1' and S2' are different in phase from each other with respect to the graduation Ra.

Therefore, if the moving object R and the stationary members $S_1$, $S_1'$, $S_2$ and $S_2'$ are arranged to form capacitors, then when the capacitance between the moving object R and the stationary members $S_1$ and $S_1'$ is the maximum, the capacitance between the moving object R and the stationary members $S_2$ and $S_2'$ is the minimum. The stationary members $S_1$ and $S_1'$ are connected together and the stationary members $S_2$ and $S_2'$ are connected together. Therefore, even if the distances between the moving object R and the stationary members $S_1$ and $S_2$ are different from those between the moving object R and the stationary members $S_1'$ and $S_2'$, the difference can be cancelled in capacitance. This can be applied to the case where the moving object R is rotated in inclination state.

FIG. 9 shows a measurement circuit including the sensor unit connected as described above. Crystal resonators $X_1$ and $X_2$ are used in combination with oscillators $OSC_1$ and $OSC_2$, respectively. The oscillating frequency of each of the crystal resonators $X_1$ and $X_2$ is fixed. However, since the crystal resonators are coupled in series to the capacitors formed by the moving object R and the stationary members $S_1$, $S_1'$ and $S_2$ and $S_2'$, the oscillating frequencies of the crystal resonators are changed as the capacitances of the capacitors change with the rotation of the moving object. The variations in capacitance of the capacitors are each a so-called "differential variation", in which while the capacitance of one capacitor is increased, the capacitance of the other is decreased. Accordingly, while the oscillating frequency of one of the oscillators $OSC_1$ and $OSC_2$ is increased, that of the other is decreased. If these two frequency signals are mixed with each other in a mixer MIX, then the difference frequency f between them can be obtained. The variations of the difference frequency f is as indicated in FIG. 5.

With this example, measurement errors attributed to the eccentricity and inclination of the moving object are scarcely caused. Thus, the amount of rotation can be measured with high accuracy.

FIG. 10 shows another method of processing the outputs of the oscillators $OSC_1$ and $OSC_2$. The outputs of the two oscillators are applied through one receiver RCV to mixers $MIX_1$ and $MIX_2$, where they are mixed with local oscillation frequencies $LO_1$ and $LO_2$ for frequency conversion, respectively. Each of the two output signals of the mixers is applied to frequency-voltage converters $FV_1$ and $FV_2$ so that each of the signals is converted to voltage signals. The voltage signals are applied to a differential amplifier DEF to provide voltage difference signals which represent the frequency difference between oscillators $OSC_1$ and $OSC_2$.

The problems that, when the difference between the output frequencies of the oscillators $OSC_1$ and $OSC_2$ is several KHz, the signal interval is 0.2 to 0.3 millisecond which cannot follow the movement of continuously moving object, and when a frequency of 10 to 20 MHz readily obtained as the output frequencies of the oscillators $OSC_1$ and $OSC_2$ is used as it is, the frequency is unsuitable for a frequency-to-voltage converter, can be solved by the arrangement shown in FIG. 10. That is, the difficulty that as the signal interval is of the order of microseconds, several KHz which is the signal variation is included in a range of error, can be eliminated.

What is claimed is:

1. A device for measuring the amount of rotation of a rotating object comprising:
   (a) sensor means including (i) a cylindrical electrode member having gear-like graduations cut on the cylindrical outer wall thereof, (ii) a first pair of electrode plate members confronting said cylindrical electrode member and having gear-like graduations on the confronting surfaces thereof to form therewith a first pair of capacitors, the relation of the graduations on the confronting surface of a first one of said first pair of electrode plate members and the graduations on the outer wall of said cylindrical electrode member being shifted 180° in phase from the relation of the graduations on the confronting surface of the other one of said first pair of electrode plate members and the graduations on the outer wall of said cylindrical electrode member, and (iii) a second pair of electrode plate members confronting said cylindrical electrode member and having gear-like graduations on the confronting surfaces thereof to form therewith a second pair of capacitors, the relation of the graduations on the confronting surface of a first one of said second pair of electrode plate members and the graduations on the outer wall of said cylindrical electrode member being the same as the relation of the graduations on the confronting surface of the first one of said first pair of electrode plate members and the graduations on the outer wall of said cylindrical electrode member and being shifted 180° in phase from the relation of the graduations on the confronting surface of the other one of said second pair of electrode plate members and the graduations on the outer wall of said cylindrical electrode member;

one of (i) said cylindrical electrode member and (ii) said first and second pairs of electrode plate members being adapted to rotate in response to rotation of the rotating object while the other one thereof is stationary, so that the capacitance of a first capacitor of each of said pairs of capacitors increases and the capacitance of the other capacitor of each of said pairs of capacitors correspondingly decreases differentially as said rotating object rotates;

(b) two oscillator circuits, one oscillator circuit having said first one of said first pair of capacitors and said first one of said second pair of capacitors incorporated therein as frequency varying components, the other oscillator circuit having said second one of said first pair of capacitors and said second one of said second pair of capacitors incorporated therein as frequency varying components; and (c) mixer means connected to said two oscillator circuits for providing a frequency difference signal determined by the difference in the frequencies of said two oscillator circuits and indicative of the extent of rotation of the rotating object.

2. A device as claimed in claim 1 in which said cylindrical electrode member is adapted to rotate in response to rotation of the rotating object and said electrode plate members are stationary.

3. A device as claimed in claim 1 in which said electrode plate members are adapted to rotate in response to rotation of the rotating object and said cylindrical electrode member is stationary.

4. A device as claimed in claim 1 in which the frequency of said mixer means is increased and decreased linearly with every unitary amount of rotation of said rotating object.

5. A device as claimed in claim 1 further comprising means for transmitting the outputs of said oscillators by wireless communication.

6. A device as claimed in claim 1 further comprising a source of local oscillation frequencies connected to said mixer means for subjecting the outputs of said oscillators to frequency conversion to obtain new frequency signals, and means for obtaining the difference frequency signal between said new frequency signals.

* * * * *